(12) United States Patent
Oda (10) Patent No.: US 6,919,509 B2
(45) Date of Patent: Jul. 19, 2005

(54) ELECTRICAL JUNCTION BOX (75) Inventor: Akihiro Oda, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/890,278

(22) Filed: Jul. 14, 2004

(65) Prior Publication Data
US 2005/0013095 A1 Jan. 20, 2005

(30) Foreign Application Priority Data

Jul. 15, 2003 (JP) .................................. 2003-197190

(51) Int. Cl.⁷ .............................................. H02G 3/18
(52) U.S. Cl. ...................... 174/59; 174/50; 439/76.2; 439/949
(58) Field of Search ............................. 174/50, 59, 60, 174/53, 57, 58, 17 R; 439/76.1, 949, 76.2, 947; 220/3.2, 3.3, 3.4, 3.6, 3.7, 3.8, 4.02; 361/600, 679, 715, 708, 601; 248/906

(56) References Cited

U.S. PATENT DOCUMENTS

| | | | | |
|---|---|---|---|---|
| 5,679,924 A | * | 10/1997 | Young et al. | ................. 174/50 |
| 6,203,358 B1 | * | 3/2001 | Kasai | .......................... 439/947 |
| 6,220,872 B1 | * | 4/2001 | Chen | ......................... 439/76.1 |
| 6,290,509 B1 | | 9/2001 | Hattori et al. | |
| 6,309,225 B2 | * | 10/2001 | Kameyama | ................ 439/76.1 |
| 6,560,115 B1 | | 5/2003 | Wakabayashi et al. | |
| 6,768,054 B2 | * | 7/2004 | Sato et al. | ..................... 174/50 |
| 2003/0086246 A1 | | 5/2003 | Wakabayashi et al. | |

FOREIGN PATENT DOCUMENTS

JP          U 5-78125       10/1993

* cited by examiner

Primary Examiner—Dean A. Reichard
Assistant Examiner—Angel R. Estrada
(74) Attorney, Agent, or Firm—Oliff & Berridge, PLC (57) ABSTRACT Casing members of an electrical junction box are provided in their sidewalls with openings for receiving a connector housing for lateral connection, respectively in order to provide an electrical junction box in which the position of a connector housing for lateral connection to be provided on a sidewall of a casing can be changed, thereby sharing the electrical junction box with different specifications of vehicles. The lateral connector housing is detachably secured to the openings. The lateral connector housing is adapted to receive a connector. A closing lid is detachably secured to the openings in the case where the connector is not connected to the housing. The openings are provided symmetrically in the right and left sidewalls of the casing members. Internal circuits are contained in the casing members. Some internal circuits adjacent the openings are formed into symmetrically same configurations and disposed symmetrically in the casing members. This enables the electrical junction box to be shared with a symmetrical arrangement in a specification of a vehicle.

4 Claims, 7 Drawing Sheets

ELECTRICAL JUNCTION BOX

CLAIM FOR PRIORITY

The present invention relates to subject-matter contained in and claims priority to JP 2003-197190, filed on Jul. 15, 2003, the entire disclosure of which is incorporated herein by reference thereto.

BACKGROUND OF THE INVENTION

1. Field of Invention

This invention relates to an electrical junction box for an automobile vehicle, and more particularly relates to an electrical junction box for an automobile vehicle having a casing a sidewall of which can receive a connector hosing for lateral connection.

SUMMARY OF THE INVENTION

2. Description of Related Art

Figure 6:
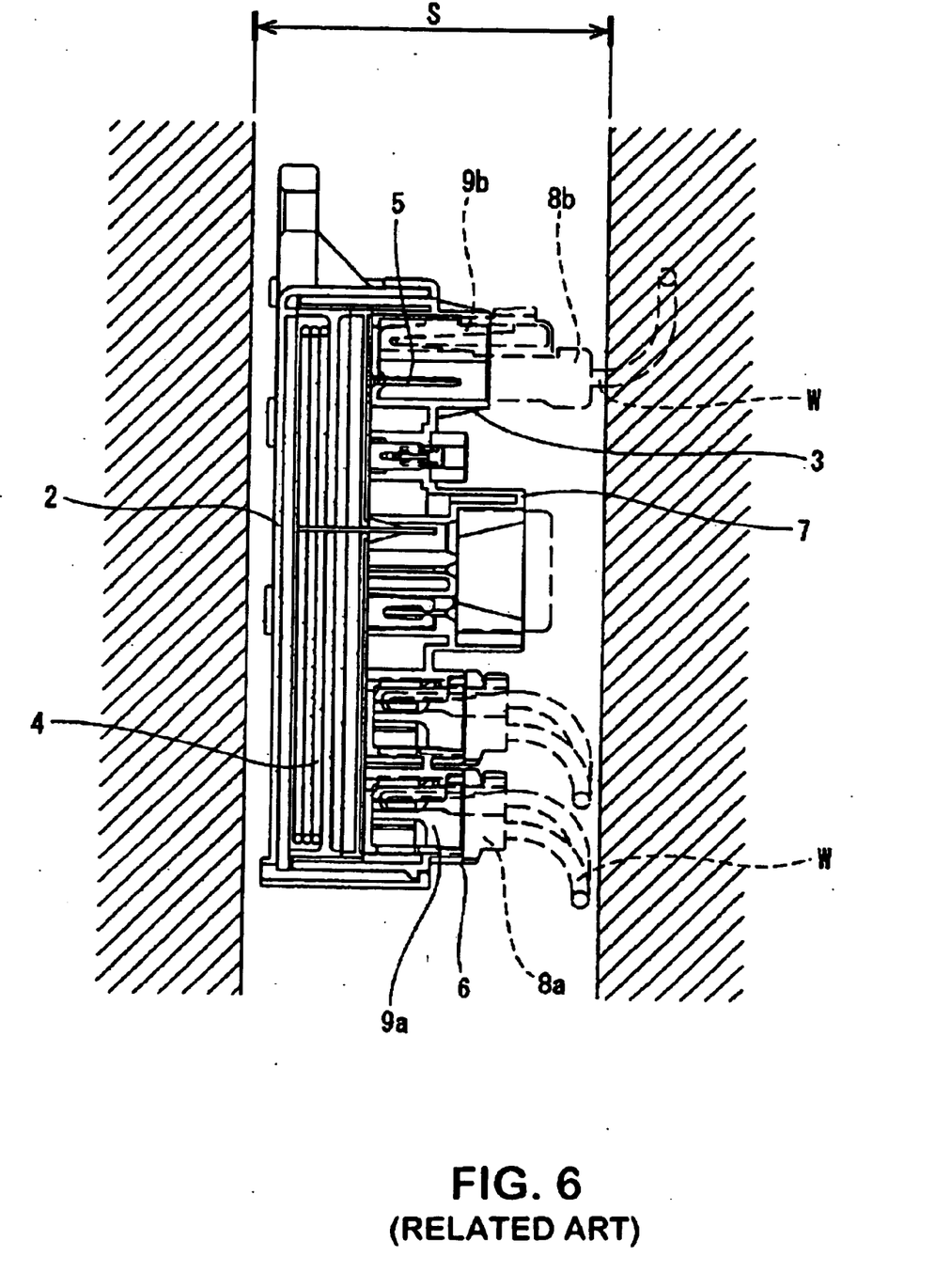
FIG. 6 is a side elevation view of a conventional electrical junction box mounted on a vehicle.

In general, as shown in FIG. 6, a conventional electrical junction box 1 for an automobile vehicle has a casing including a lower casing member 2 and an upper casing member 3. A circuit body 4 including single-core wires, bus bars, and the like is arranged in the casing. Terminals 5 are connected to the circuit body 4. The terminals 5 extend into mounting sections 6 on the surface of the upper casing member 3. Connector hoods 9a, 9b . . . are formed integrally on the mounting sections 6 to receive a socket 7 for a relay or a fuse and mating connectors 8a, 8b. . . .

Because the connector hoods 9a, 9b . . . are provided on the surface of the upper casing member 3 in the above electrical junction box 1, a great space is required in the thickness direction of the electrical junction box 1 in order to dispose in the vehicle the electrical junction box 1 including the mating connectors 8a, 8b . . . , which are coupled to the connector hoods 9a, 9b . . . , and electrical wires W that are inserted into the mating connectors 8a, 8b . . . . Consequently, if an arrangement space S is narrow in the vehicle, there may be a case where the mating connectors 8a, 8b . . . having a great size cannot be coupled to the connector hoods 9a, 9b. . . .

Figure 7:
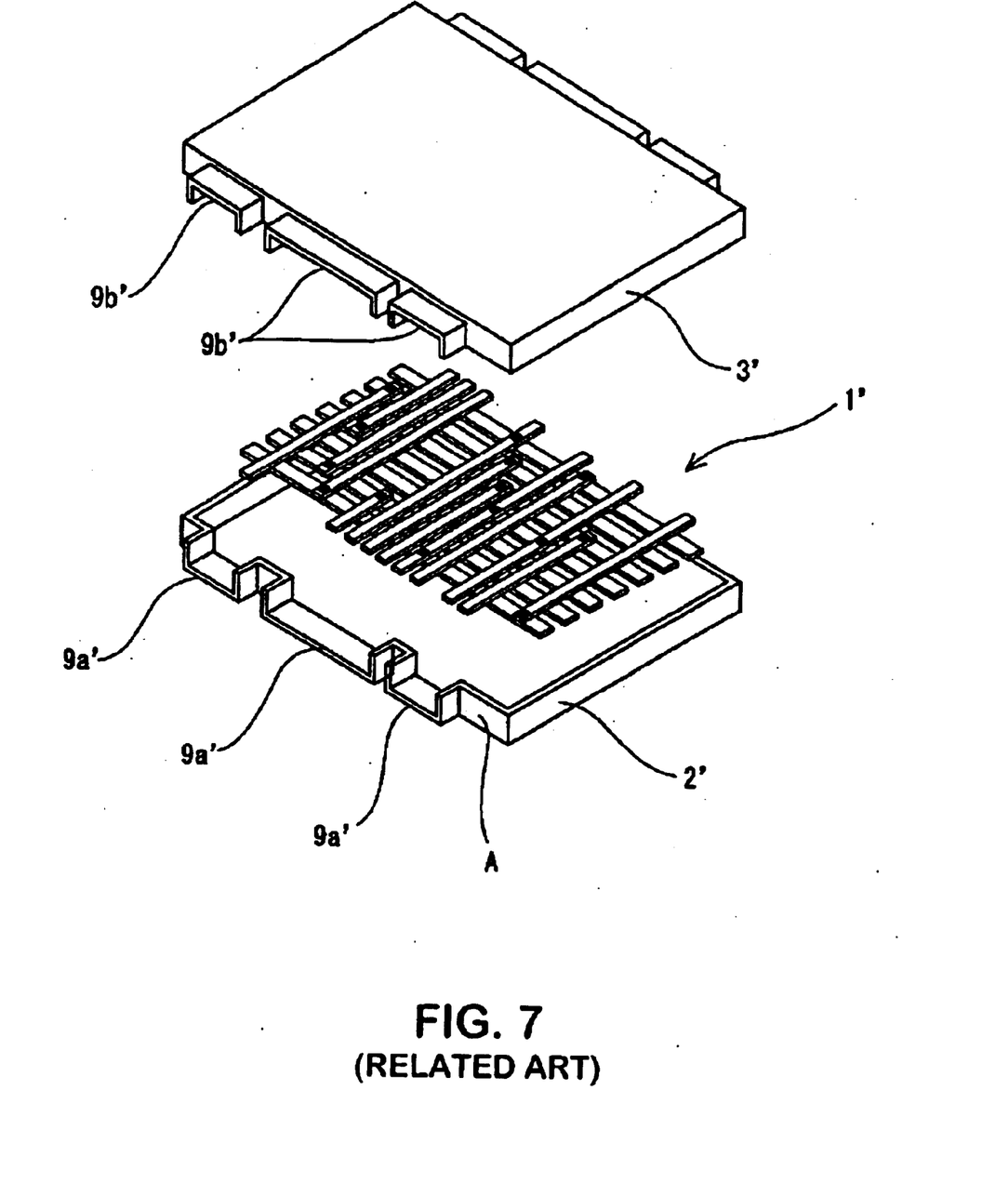
FIG. 7 is an exploded perspective view of a conventional electrical junction box.

As shown in FIG. 7, it is possible to dispose an electrical junction box in a narrow space in the vehicle by using an electrical junction box 1' in which connector hood sections 9a' and 9b' are provided on sidewalls A of a lower casing member 2' and an upper casing member 3'. See Japanese Patent Public Disclosure 2000-182682.

SUMMARY OF THE INVENTION

However, because the connector hood sections 9a' and 9b' must be fixed on the predetermined positions in the above electrical junction box 1' and the mating connectors must be coupled to the hood sections 9a' and 9b' in the predetermined lateral direction, it is necessary to prepare additional electrical junction boxes 1' in which the positions of the connector hood sections 9a' and 9b' are changed in accordance with the respective arrangement conditions of the electrical junction boxes 1'.

For example, in the case where there is a difference between the specifications for right and left side steering wheels, it is necessary to prepare two kinds of electrical junction boxes 1' in which the connector hood sections 9a' and 9b' are disposed on the sidewalls A symmetrically in the right and left direction. Consequently, it was impossible to share the electrical junction box 1' having the same function with the different specifications.

In order to overcome the above problems, an object of various exemplary embodiments is to provide an electrical junction box in which the position of a connector housing for lateral connection to be provided on a sidewall of a casing can be changed.

In order to achieve the above object, various exemplary embodiments provide an electrical junction box comprising a casing provided in a sidewall thereof with an opening; a connector housing for lateral connection detachably secured to the opening, the lateral connector housing being adapted to receive a connector; and a closing lid adapted to be detachably secured to the opening in place of the lateral connector housing in the case where the connector is not coupled to the housing.

According to the above construction, it is possible to selectively attach either of the connector housing for lateral connection and the closing lid to the opening formed in the sidewall of the casing. Accordingly, it is possible to arrange the lateral connector housing on the optimum position for connection of the mating connector in compliance with the arrangement condition of the electrical junction box in the vehicle. Also, because the lateral connector housing is formed into a single element, the housing cannot be deformed by improper connection of the mating connector.

To be more specific, openings for receiving the lateral connector housing are provided symmetrically in the right and left sidewalls of the casing. Internal circuits are contained in the casing. Some internal circuits adjacent the openings are formed into symmetrically same configurations with respect to the right and left direction. The lateral connector housing is detachably secured to one of the openings to receive the connector in conjunction with the closing lid is detachably secured to the other of the openings.

Thus, where the lateral connector housing is required for different locations in, for example, vehicles with a right side steering wheel and a left side steering wheel, the body of the electrical junction box can be shared with vehicles having different specifications by changing the arrangement of the lateral connector housing and closing lid with respect to the right and left direction.

More specifically, the connector to be connected to the lateral connector housing has a greater height and a greater amount of projection from an outer surface of the casing.

Thus, even when the connector having a greater height and a greater amount of projection from the outer surface of the casing is coupled to the connector housing, it is possible to reduce the attachment space in the thickness direction of the electrical junction box, because the lateral connector housing provided on the sidewall of the casing can receive the tall connector.

The casing includes an upper casing member and a lower casing member. The opening extends into parts of the members. The opening is provided in a peripheral edge thereof with a groove. A sealing lip projects from the outer peripheral surface of the lateral connector housing to be fitted in the groove.

According to the above construction, when the upper casing member and lower casing member clamp the lateral connector housing in the vertical direction in conjunction with fitting the sealing lip into the grooves, the lateral connector housing can be fixed between the upper and lower casing members, thereby effecting dust-proof and water-proof functions around the opening. Also, when interconnecting the upper and lower casing members, it is possible to easily carry out an assembling work of the electrical junction box by mounting the lateral connector housing laterally on the tab extending into the housing before hand.

BRIEF DESCRIPTION OF THE DRAWINGS

The accompanying drawings, which are incorporated into and constitute a part of the specification, illustrate one or more embodiments of the invention, and taken with the detailed description, serve to explain the principles and implementation of the invention. In the drawings.

DETAILED DESCRIPTION OF EXEMPLARY EMBODIMENTS

Referring now to the drawings, exemplary embodiments of an electrical junction box will be described below.

Figure 1:
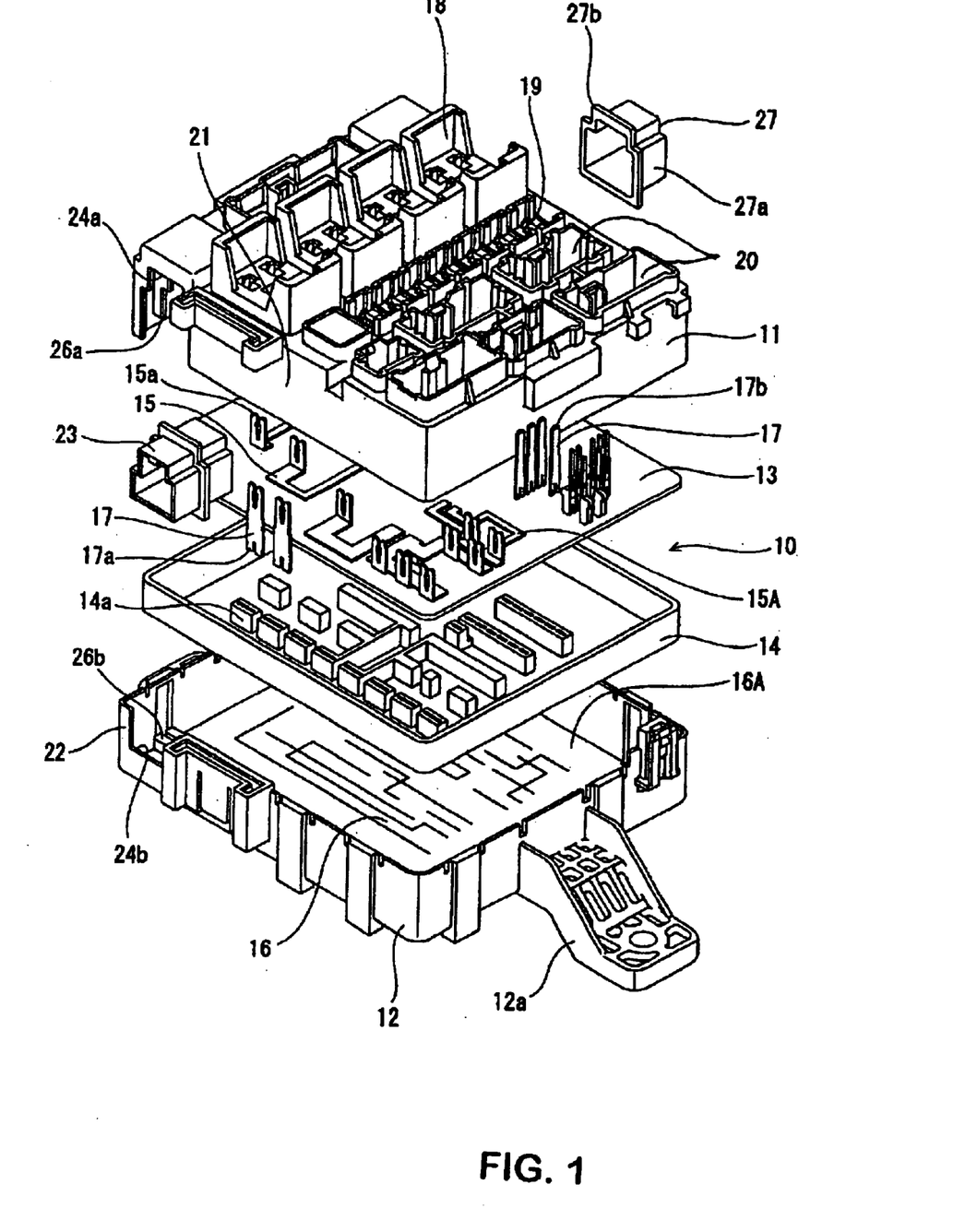
FIG. 1 is a perspective view of an embodiment of an electrical junction box in accordance with various exemplary embodiments.

FIG. 1 is an exploded perspective view of an electrical junction box 10. The electrical junction box 10 includes a casing made of a synthetic resin material and having an upper casing member 11 and a lower casing member 12, insulation plates 13 and 14 stacked between the upper and lower casing members 11 and 12, and arrangement elements such as bus bars 15 and single-core wires 16, insulation displacement terminals 17 to be connected to the single-core wires 16.

Circuit bodies 16A comprising the single-core wires 16 are arranged along given patterns in the lower casing member 12. A number of insulation displacement terminals 17 are supported by terminal-holding sections 14a on a lower insulation plate 14. When lower press-contact portions 17a of the insulation displacement terminals 17 press the single-core wires 16, the wires 16 are connected to the terminals 17 at the predetermined positions, respectively.

Circuit bodies 15A including the bus bars 15 are arranged in given patterns on the upper insulation plate 13. An end of each bus bar 15 is bent up toward the upper casing member 11. The distal end of the bus bar 15 is formed into a terminal portion 15a including an insulation displacement portion or a tab portion.

Relay-receiving sections 18, fuse-receiving sections 19, and connector-receiving sections 20 are juxtaposed on the top surface of the upper casing member 11. The respective terminal portions 15a bent up from the insulation plate 13 and the terminal portions 17b including the insulation displacement portions or tab portions formed on the upper ends of the insulation displacement terminals 17 supported on the insulation plate 14 are contained in the respective relay-receiving sections 18, fuse-receiving sections 19, and connector-receiving sections 20.

Figure 2A:
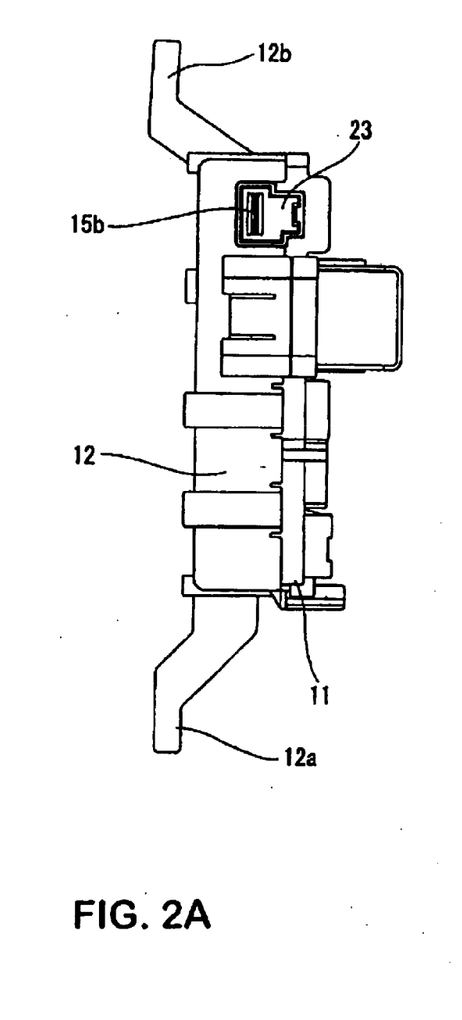
FIG. 2A is a side elevation view of the electrical junction box, illustrating a position where an upper casing member is mounted on a lower casing member.
Figure 2B:
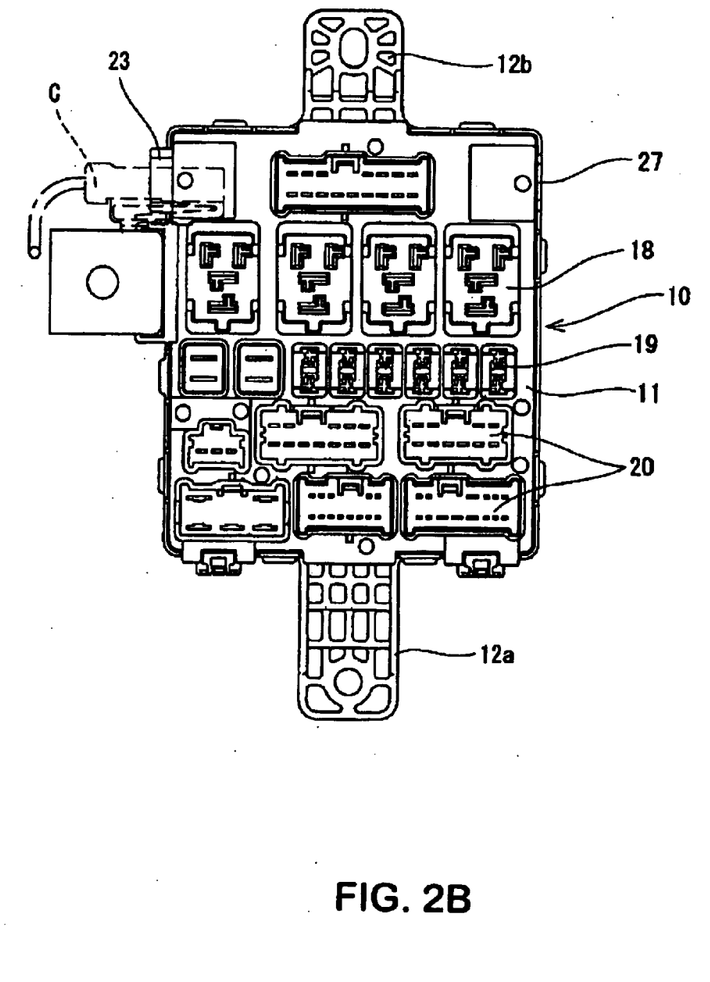
FIG. 2B is a plan view of the electrical junction box shown in FIG. 2A.

As shown in FIGS. 2A and 2B, the upper casing member 11 is fitted on the lower casing member 12 with a sidewall 21 of the member 11 contacting with an inner peripheral surface of a sidewall 22 of the member 12. The members 11 and 12 are secured to each other by locking means.

As shown in FIG. 2A, in addition to the connector-receiving sections 20 on the upper casing member 11, a connector housing 23 for lateral connection is provided in the electrical junction box 10. The lateral connector housing 23 extends perpendicularly to the sidewalls of the upper and lower casing members 11 and 12.

Figure 3:
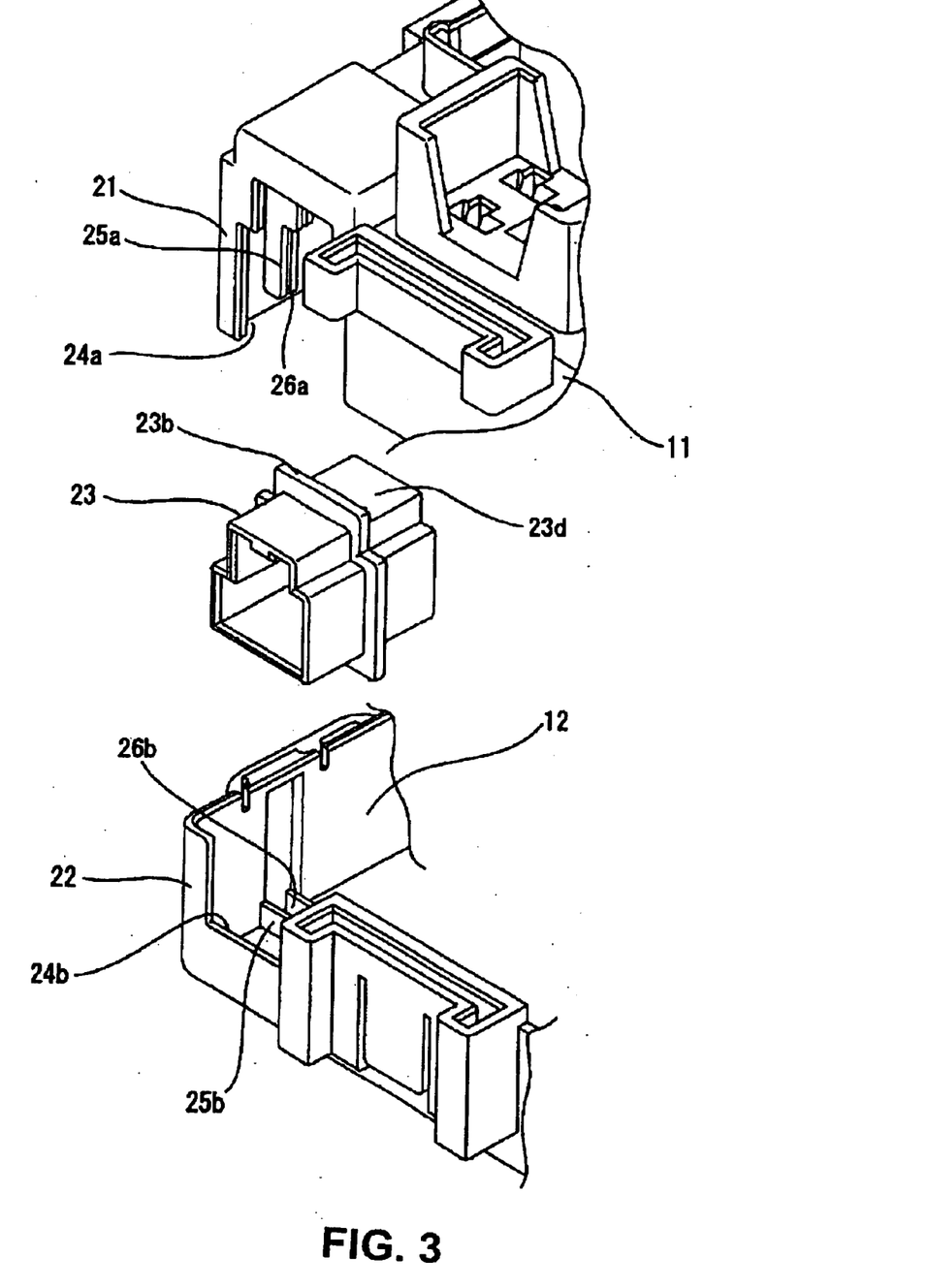
FIG. 3 is an exploded perspective view of main parts of the upper and lower casing members and a connector housing for lateral connection.
Figure 4A:
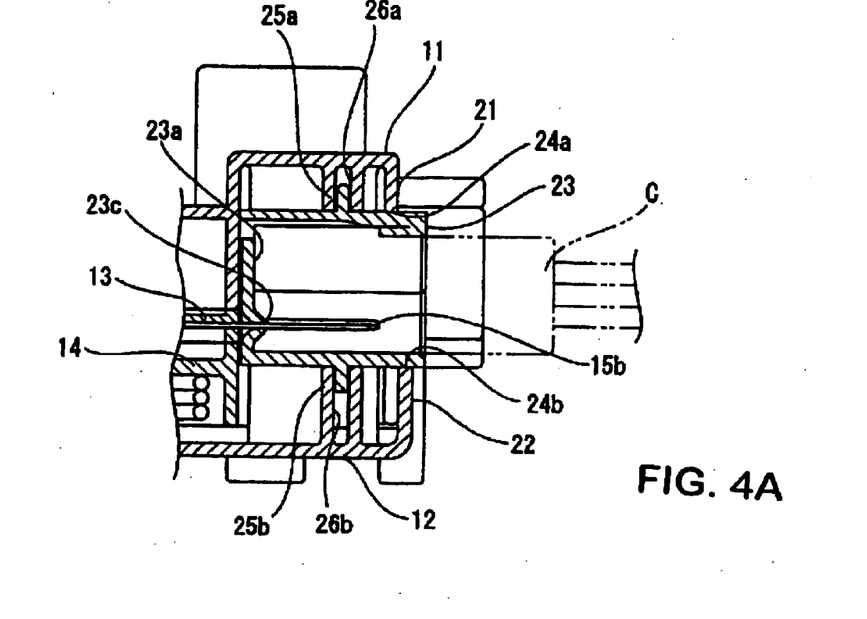
FIG. 4A is a sectional view of a part of the electrical junction box at the side on which the connector housing for lateral connection is fixed.

As shown in FIG. 3, the lateral connector housing 23 is separated from the upper and lower casing members 11 and 12 and is made of a synthetic resin material. The housing 23 has a hood corresponding to an external configuration of a mating connector C (FIG. 4A). The hood is open at the front side to form an inlet for the mating connector C and includes a partition 23a (FIG. 4A) at the rear side and a peripheral wall 23d extending from the partition 23a to the inlet.

The partition 23a is provided with a through-hole 23c (FIG. 4A) for guiding the tab 15b of the bus bar 15 into the interior of the lateral connector housing 23. The lateral connector housing 23 is provided on the substantially central part of the outer peripheral surface 23d with a flange-like sealing lip 23b that extends outward from the whole outer peripheral surface 23d.

The upper and lower casing members 11 and 12 are provided at the corresponding positions of the right and left sidewalls 21 and 22 with openings 24a and 24b so that the openings 24a and 24b extend into the sidewalls 21 and 22. The openings 24a and 24b are adapted to clamp the outer peripheral surface 23d of the connector housing 23 for lateral connection in the vertical direction. Each of the openings 24a and 24b is provided on each peripheral edge with a pair of ribs 25a and a pair of ribs 25b that can laterally engage the sealing lip 23b that extends outward from the lateral connector housing 23.

When the upper and lower casing members 11 and 12 are interconnected, the sealing lip 23b of the lateral connector housing 23 is fitted in grooves 26a and 26b defined between the pair of ribs 25a and the pair of ribs 25b so that the lateral connector housing 23 can be detachably secured between the upper and lower casing members 11 and 12. When the lateral connector housing 23 is secured to the upper and lower casing members 11 and 12, as shown in FIG. 4A, the whole front outer peripheral surface is clamped by the inner surfaces of the openings 24a and 24b in the upper and lower casing members 11 and 12 in conjunction with the distal end of the housing 23 extends slightly outward from the sidewalls 21 and 22 in a direction perpendicular to the sidewalls 21 and 22.

The connector housing 23 for lateral connection will have advantages under the condition: when a mating connector C to be connected is fitted to the top surface of the upper casing member 11; when a size in height of the electrical junction box 10 including a height for bending the electrical wires becomes great and the electrical junction box 10 cannot be contained in a given space in the thickness direction of the box; or when the connector to be connected must be received near the sidewalls 21 and 22.

In particular, the lateral connector housing 23 has a further advantage under the condition when the connector to be connected has a great height and a great amount of projection outward from the casing upon engagement. In the present embodiment, the lateral connector housing 23 is disposed in the sidewalls 21 and 22 of the upper and lower members 11 and 12 to contain the tall connector C.

Figure 4B:
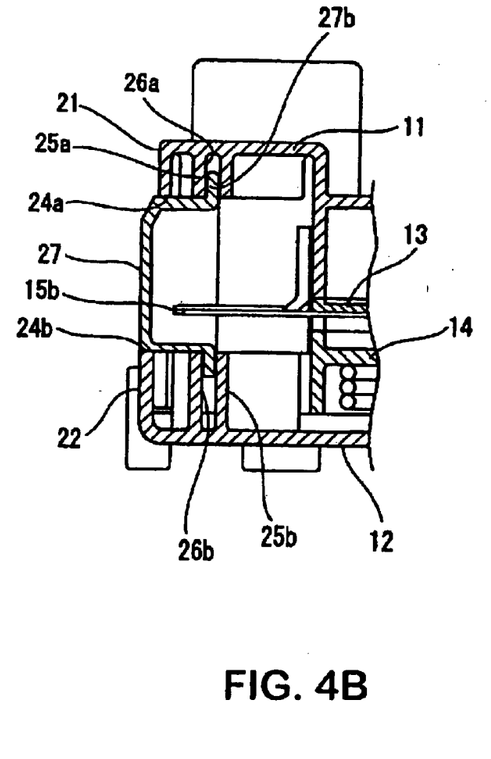
FIG. 4B is a sectional view of a part of the electrical junction box at the side on which a closing lid is fixed.
Figure 4C:
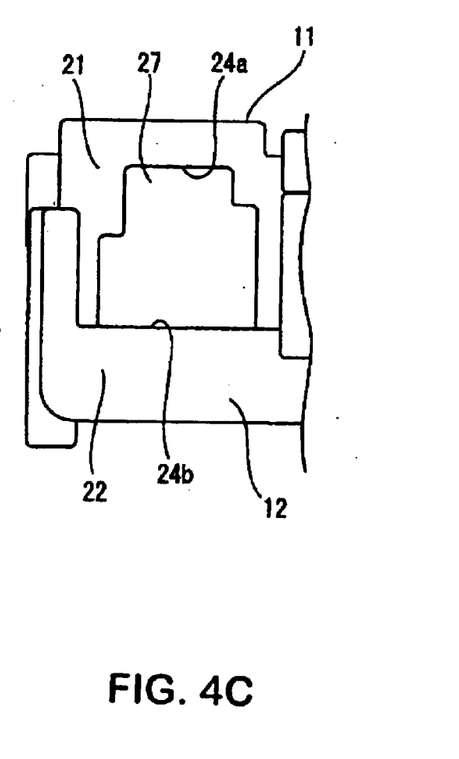
FIG. 4C is a side elevation view of a part of the electrical junction box to which the closing lid is secured.

In this embodiment, as shown in FIGS. 4B and 4C, a cap-like closing lid 27 is detachably attached to the openings 24a and 24b to cover them in place of the lateral connector housing 23, in the case where the connector C is not received in the openings 24a and 24b. The closing lid 27, as shown in FIG. 1, is separated from the upper and lower casing members 11 and 12 and is made of a synthetic resin material.

The closing lid 27 has a barrel 27a with an outer size corresponding to an inner size of the integrated openings 24a and 24b when the upper and lower casing members 11 and 12 are interconnected. The barrel 27a is provided on the rear end of the outer peripheral surface with a lip 27b to be fitted in the grooves 26a and 26b in the same manner as the sealing lip 23b of the lateral connector housing 23. The barrel 27a is closed at the front end. When the upper and lower casing members 11 and 12 are interconnected, the lip 27a is fitted in the grooves 26a and 26b defined between the ribs 25a and 25b, thereby detachably securing the lid 27 to the openings 24a and 24b.

The circuit bodies 15A adjacent the openings 24a and 24b in the sidewalls 21 and 22 are formed into the symmetrical same configurations in the right and left direction. Tabs 15b of the circuit bodies 15A are disposed symmetrically to be connected to the mating connector C. Thus, even if the lateral connector hosing 23 is attached to the openings 24a and 24b at either right or left side, the mating connector C can be connected to the same circuit. When the lateral connector housing 23 is secured to the openings 24a and 24b at either right or left side, the tab 15b can be inserted through the through-hole 23c into the interior of the lateral connector housing 23.

Next, an operational of the electrical junction box 10 constructed above will be explained below.

Firstly, as shown in FIG. 1, internal mounting elements such as the insulation plates 13 and 14, bus bars 15, single-core wires 16, and insulation displacement terminals 17 are disposed in the lower casing member 12. Secondly, the lateral connector housing 23 is disposed on the left side (in FIG. 1) of the sidewalls 21 and 22 in conjunction with the closing lid 27 is disposed on the right side (in FIG. 1).

At this time, the tab 15b that is opposed to the openings 24a and 24b is inserted into the through-hole 23c in the lateral connector housing 23 and the sealing lip 23b of the lateral connector housing 23 is fitted in the groove 26b, thereby positioning the lateral connector housing 23 in the lower casing member 12. Similarly, the closing lid 27 is positioned at the opposing side in the lower casing member 12 by inserting the lip 27b of the closing lid 27 into the groove 26b. Thirdly, when the upper casing member 11 is mounted on the lower casing member 12, the sealing lip 23b of the lateral connector housing 23 and the lip 27b of the closing lid 27 are inserted into the grooves 26a in the upper casing member 11.

As shown in FIG. 4A, the connector housing 23 for lateral connection is secured between the upper and lower casing members 11 and 12 by the inner surfaces of the ribs 25a, 25b and the openings 24a and 24b. The tab 15b extends in a cantilever manner in the interior of the lateral connector housing 23. On the other hand, as shown in FIG. 4B, the closing lid 27 is also secured to the openings 24a and 24b by the inner surfaces of the ribs 25a, 25b and the openings 24a and 24b. The closing lid 27 closes the inlet of the openings 24a and 24b (FIG. 4C).

Thus, the electrical junction box 10 mounts the lateral connector housing 23 on the one side of the box and mounts the closing lid 27 on the other side of the box in symmetry with each other (FIG. 2A). Upon attachment of the electrical junction box 10, leg portions 12a and 12b projecting from the opposing sides of the lower casing member 12 serve to secure the electrical junction box 10 to the given position of a vehicle. A mating connector (not shown) is mounted on the connector-receiving section 20 disposed on the top surface of the upper casing member 11. Also, the mating connector C is laterally engaged with the lateral connector housing 23 to be connected to the tab 15b.

Figure 5:
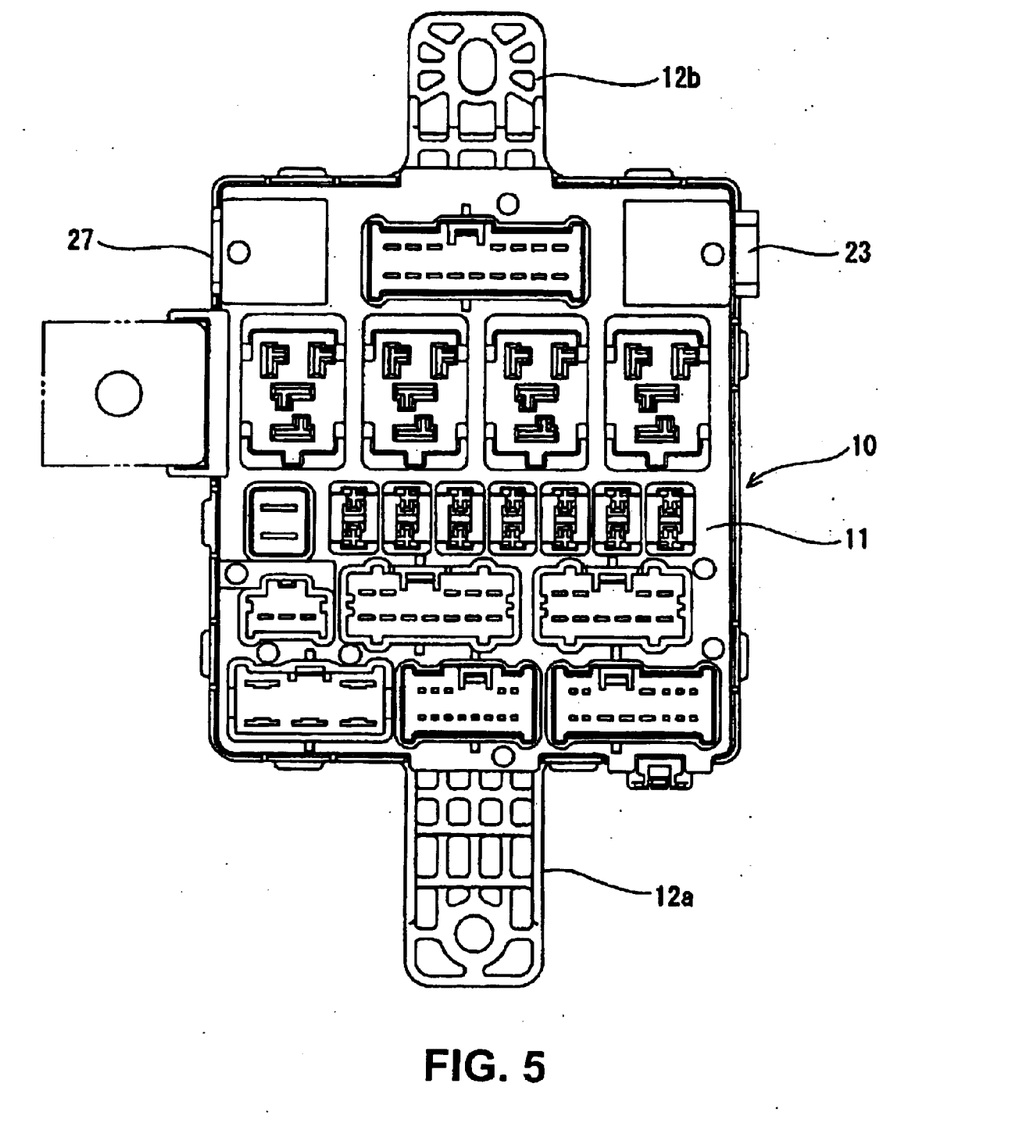
FIG. 5 is a plan view of the electrical junction box in which an arrangement of the connector housing for lateral connection and the closing lid is altered.

In the above embodiment of the electrical junction box 10, the openings 24a and 24b are provided in the right and left sidewalls of the upper and lower casing members 11 and 12 so that either of the lateral connector housing 23 and closing lid 27 is selectively attached to either of the right and left openings 24a and 24b. Accordingly, as shown in FIG. 5, it is possible to fix the lateral connector housing 23 on the right side and to fix the closing lid 27 on the left side on the contrary of the arrangement of the above embodiment shown in FIG. 1.

Therefore, in the case where the attachment positions of the lateral connector housing 23 are different on the basis of specifications for right left side steering wheels, it is possible to share the electrical junction box 10 with the specifications only by changing the attachment position of the lateral connector housing 23.

Although the grooves 26a and 26b are provided in the inner part from the sidewalls 21 and 22 in the above embodiment, the grooves 26a and 26b may be provided in the inner peripheral edges of the openings 24a and 24b in the sidewalls 21 and 22 to receive the sealing lip 23b of the lateral connector housing 23. The grooves 26a and 26b may be formed in the sidewalls 21 and 22 or openings 24a and 24b.

Also, although the closing lid 27 in the above embodiment is formed into a cap-like configuration, the lid 27 may be formed into a plate-like configuration with a lip 27b on a peripheral end thereof. The closing lid 27 may be formed into any configuration so long as the lid 27 can close the openings 24a and 24b. Furthermore, although the openings 24a and 24b are arranged symmetrically on two right and left positions in the above embodiment, they may be provided on any two positions of the sidewalls of the upper and lower casing members 11 and 12.

It will be apparent from the foregoing that according to various exemplary embodiments, because the connector housing for lateral connection is provided on the sidewall of the casing, it is possible to reduce the attachment space in the thickness direction of the electrical junction box by utilizing the lateral connector housing. Because the lateral connector housing is detachably secured to the opening in the sidewall of the casing, it is not necessary to prepare many kinds of electrical junction box having different locations of the lateral connector housings by means of change of the arrangement of the lateral connector housing, thereby sharing the electrical junction box. Also, because the closing lid can be mounted on the opening that does not receive the lateral connector housing, it is possible to carry out dustproof and waterproof around the opening.

Although the invention has been described with reference to particular means, materials and exemplary embodiments, it is to be understood that the invention is not limited to the particulars disclosed and extends to all equivalents within the scope of the claims. It is evident that many alternatives, modifications, and variations will be apparent to those skilled in the art in light of the foregoing description. It is therefore contemplated that the appended claims will embrace any such alternatives, modifications, and variations as falling within the true scope and spirit of the invention.

What is claimed is:

1. An electrical junction box, comprising:
   a casing provided in a sidewall thereof with an opening;
   a connector housing for lateral connection detachably secured to the opening, the lateral connector housing being adapted to receive a connector, and
   a closing lid adapted to be detachably secured to the opening in place of the lateral connector housing in the case where the connector is not coupled to the housing, wherein the casing includes an upper casing member and a lower casing member, the opening extends into parts of the members, the opening is provided in a peripheral edge thereof with a groove, a sealing lip projects from the outer peripheral surface of the lateral connector housing so that the sealing lip is fitted in the groove.

2. The electrical junction box according to claim 1, wherein openings for receiving the lateral connector housing are provided symmetrically in the right and left sidewalls of the casing, internal circuits are contained in the casing, some internal circuits adjacent the openings are formed into symmetrically same configurations with respect to the right and left direction; and wherein the lateral connector housing is detachably secured to one of the openings to receive the connector in conjunction with the closing lid is detachably secured to the other of the openings.

3. The electrical junction box according to claim 1, wherein the connector to be connected to the lateral connector housing has a greater height and a greater amount of projection from an outer surface of the casing.

4. The electrical junction box according to claim 2, wherein the connector to be connected to the lateral connector housing has a greater height and a greater amount of projection from an outer surface of the casing.

* * * * *